(12) United States Patent
Knisley et al.

(10) Patent No.: US 11,286,564 B2
(45) Date of Patent: Mar. 29, 2022

(54) TIN-CONTAINING PRECURSORS AND METHODS OF DEPOSITING TIN-CONTAINING FILMS

(71) Applicant: Applied Materials, Inc., Santa Clara, CA (US)

(72) Inventors: Thomas Knisley, Monroe, MI (US); Mark Saly, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 41 days.

(21) Appl. No.: 16/456,964

(22) Filed: Jun. 28, 2019

(65) Prior Publication Data

US 2020/0002814 A1 Jan. 2, 2020

Related U.S. Application Data

(60) Provisional application No. 62/692,754, filed on Jun. 30, 2018.

(51) Int. Cl.
| | | |
|---|---|---|
| *C23C 16/30* | (2006.01) | |
| *C23C 16/455* | (2006.01) | |
| *C09D 1/00* | (2006.01) | |
| *C01G 19/02* | (2006.01) | |
| *C01B 32/914* | (2017.01) | |
| *C01B 35/04* | (2006.01) | |
| *C01B 33/06* | (2006.01) | |
| *C01B 21/06* | (2006.01) | |

(52) U.S. Cl.
CPC .... *C23C 16/45553* (2013.01); *C01B 21/0635* (2013.01); *C01B 32/914* (2017.08); *C01B 33/06* (2013.01); *C01B 35/04* (2013.01); *C01G 19/02* (2013.01); *C09D 1/00* (2013.01); *C23C 16/30* (2013.01)

(58) Field of Classification Search
CPC ......... C23C 16/30; C23C 16/32; C23C 16/34; C23C 16/38; C23C 16/40; C23C 16/407; C23C 16/42; C23C 16/45525; C23C 16/45553; C23C 16/18
See application file for complete search history.

(56) References Cited

U.S. PATENT DOCUMENTS

| | | | |
|---|---|---|---|
| 2012/0027937 A1* | 2/2012 | Gordon | C23C 16/407 427/337 |
| 2013/0251903 A1* | 9/2013 | Han | C07F 15/045 427/252 |
| 2014/0119977 A1 | 5/2014 | Gatineau et al. | |
| 2014/0242298 A1* | 8/2014 | Lansalot-Matras | C23C 16/18 427/576 |
| 2015/0004314 A1* | 1/2015 | Winter | C01G 3/05 427/252 |
| 2015/0105573 A1* | 4/2015 | Romero | C23C 16/18 556/32 |
| 2018/0037540 A1* | 2/2018 | Yoshino | C23C 16/45553 |

FOREIGN PATENT DOCUMENTS

| KR | 10-20120053479 A | 5/2012 |
|---|---|---|
| WO | 2012176988 A1 | 12/2012 |

OTHER PUBLICATIONS

PCT International Search Report and Written Opinion in PCT/US2019/039768 dated Oct. 18, 2019, 12 pages.
Gans-Eichler, Timo , et al., "The Transfer of Tin and Germanium Atoms from N-Heterocyclic Stannylenes and Germylenesto Diazadienes", Chem. Eur. J. 2006, 12, pp. 1162-1173.
Kim, S. B., et al., "Synthesis of N-heterocyclic stannylene (Sn(II)) and germylene (Ge(II)) and a Sn(II) amidinate and their application as precursors for atomic layer deposition", Chemistry of Materials, 2014, vol. 26, pp. 3065-3073.
Mansell, Stephen M., et al., "Synthesis and Structural Characterization of Tin Analogues of N-Heterocyclic Carbenes", Inorg. Chem. 2008, 47, 11367-11375.
Mansell, S.M. , et al., "Synthesis of chelating diamido Sn(IV) compounds from oxidation of Sn(II) and directly from Sn(IV) precursors", Dalton Trans., 2015, 44, 9756-9765.
Rosello-Merino, Marta , et al., "Synthesis and reactivity of fluorenyl-tethered N-heterocyclic stannylenes", Dalton Trans., 2016, 45, 6282-6293.

* cited by examiner

*Primary Examiner* — Elizabeth A Burkhart
(74) *Attorney, Agent, or Firm* — Servilla Whitney LLC

(57) ABSTRACT

Tin containing precursors and methods of forming tin-containing thin films are described. The tin precursor has a tin-diazadiene bond and is homoleptic or heteroleptic. A suitable reactant is used to provide one of a metallic tin film or a film comprising one or more of an oxide, nitride, carbide, boride and/or silicide. Methods of forming ternary materials comprising tin with two or more of oxygen, nitrogen, carbon, boron, silicon, titanium, ruthenium and/or tungsten are also described.

5 Claims, No Drawings

TIN-CONTAINING PRECURSORS AND METHODS OF DEPOSITING TIN-CONTAINING FILMS

CROSS-REFERENCE TO RELATED APPLICATIONS

This application claims priority to U.S. Provisional Application No. 62/692,754, filed Jun. 30, 2018, the entire disclosure of which is hereby incorporated by reference herein.

TECHNICAL FIELD

Embodiments of the disclosure generally relate to deposition of tin-containing thin films. More particularly, embodiments of the disclosure relate to methods of forming tin-containing films using tin diazadiene type complexes.

BACKGROUND

The semiconductor industry faces many challenges in the pursuit of device miniaturization which involves rapid scaling of nanoscale features. Such issues include the introduction of complex fabrication steps such as multiple lithography exposures and integration of high performance materials. To produce the nanoscale features for next-generation semiconductor devices, a new lithographic source using extreme ultraviolet (EUV) photons is needed. One current disadvantage of EUV lithography is the very low throughput of wafers due to limited amount of photons available to perform patterning.

Unfortunately, there are a limited number of viable chemical precursors available that have the requisite properties of robust thermal stability, high reactivity, and vapor pressure suitable for film growth to occur. In addition, precursors that often meet these requirements still suffer from poor long-term stability and lead to thin films that contain elevated concentrations of contaminants such as oxygen, nitrogen, and/or halides that are often deleterious to the target film application. Therefore, there is a need for improved thin film precursors containing tin and methods of forming tin-containing films.

SUMMARY

One or more embodiments of the disclosure is directed to methods comprising exposing a substrate in a processing chamber to a deposition cycle comprising exposure to a tin precursor comprising a compound having a tin-diazadiene bond and a reactant to form a tin-containing film.

Additional embodiments of the disclosure are directed to methods of forming a tin-containing film. A substrate is exposed to a deposition cycle comprising at least one exposure to a tin precursor and at least one exposure to a reactant. The tin precursor comprises a tin-diazadiene bond. The reactant comprises one or more of an oxidizing agent, a nitriding agent, a carbiding agent or a siliciding agent. The deposition cycle is repeated, in whole or in part, until tin-containing film of a predetermined thickness has been formed on the substrate.

Further embodiments of the disclosure are directed to methods of forming a tin-containing film on a substrate. A substrate in a processing chamber is exposed to at least one deposition cycle to form a ternary material. The at least one deposition cycle comprises exposure to a tin precursor comprising a compound having a tin-diazadiene bond and one or more reactant to form a ternary material including one or more of oxygen, nitrogen, carbon, boron, silicon, titanium, ruthenium or tungsten atoms.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on a layer formed on the substrate as disclosed in more detail below, and the term "substrate surface" is intended to include such layer as the context indicates. Thus for example, where a film/layer or partial film/layer has been deposited onto a substrate surface, the exposed surface of the newly deposited film/layer may be described as the substrate surface. What a given substrate surface comprises will depend on what materials are to be deposited, as well as the particular chemistry used.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber. These reactive compounds may be separated temporally or spatially.

In a time-domain ALD process, exposure to each reactive compound is separated by a time delay to allow each compound to adhere and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, may be introduced into the processing chamber to purge the reaction zone or otherwise remove any residual reactive compound or reaction products or by-products from the reaction zone. In some embodiments, the purge gas may flow continuously throughout the deposition process so that only the purge gas flows during the time delay between pulses of reactive compounds. The reactive compounds are alternately pulsed until a predetermined film or film thickness is formed on the substrate surface. In either scenario (discrete purge gas pulses or continuous purge gas flow), the ALD process of pulsing compound A, purge gas, compound B and purge gas may be referred to as a cycle. A cycle can start with either compound A or compound B and may continue the respective order of the cycle until achieving a film with the predetermined thickness.

In one aspect of a spatial ALD process, a first reactive gas and second reactive gas are delivered simultaneously to the reaction zone but are separated by a purge gas curtain and/or a vacuum curtain. The gas curtain can be a combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

One or more embodiments of the disclosure advantageously provide a new precursor class for depositing tin-containing films. Some embodiments advantageously provide methods of depositing tin-containing films using a new class of precursors. In some embodiments, the deposition is by an atomic layer deposition (ALD) process. In some embodiments, the deposition is by a chemical vapor deposition (CVD) process in which both the tin-containing precursor and the reactants are exposed to the substrate at the same time so that the tin-containing precursor and reactant are allowed to react in the gas phase.

Some embodiments of the disclosure advantageously provide simplified integration schemes for implementing EUV (extreme ultraviolet) lithography patterning schemes. One current disadvantage of EUV lithography is the very low throughput of wafers due to limited amount of photons available to perform patterning. Some embodiments advantageously provide methods to deposit Sn-containing materials that optimize absorption of EUV photons allowing current generation EUV tools to become more efficient leading to higher wafer throughput in production.

In some embodiments, a diazadienyl-containing tin precursor is used to produce one or more of tin metal (Sn), tin oxide (SnO), tin nitride (SnN), tin carbide (SnC), tin silicide (SnSi), or a film comprising tin and having one or more of oxygen (O), nitrogen (N), carbon (C), boron (B) or silicon (Si) atoms. The skilled artisan will recognize that the chemical formula of the tin film does not imply any particular stoichiometric ratio of atoms unless specifically stated as such. For example, a tin oxide film may be referred to as "SnO" or "$SnO_x$," and the composition of the film comprises tin and oxygen atoms. Some embodiments of the disclosure advantageously provide methods of forming ternary materials comprising tin and two or more of oxygen, nitrogen, carbon, boron, silicon, titanium, tungsten and/or ruthenium atoms. Some examples of ternary materials include, but are not limited to, SnON, SnOC, SnBN, RuSnB, SnSiO, SnBO, SnTiO, SnTiN, SnWN and SnTiW.

Some embodiments of the disclosure advantageously provide methods of forming highly-pure tin-containing films with low impurities. The high reactivity, high volatility, and/or high thermal stability of the disclosed tin-containing precursors are believed to be due to the chemical nature of the tin-diazadiene (Sn-DAD) bond. Such a film is useful, for example, with EUV lithography applications where low EUV photon flux is present and maximum photon utility is sought. It is believed that Sn-containing films may constructively interact with a primary EUV photon (from main EUV source) to produce secondary effects that may aid in the lithographic processes. This highly reactive, redox-active diazadienyl system is believed to yield a highly pure film and free diazadiene which is liberated into the purge gas stream preventing unwanted incorporation into the newly produced tin-containing thin film.

In one or more embodiments, the tin-containing precursor has at least one diazadiene ligand. Diazadiene ligands can adopt several resonance forms when binding to a tin atom as depicted in scheme (I) or (II).

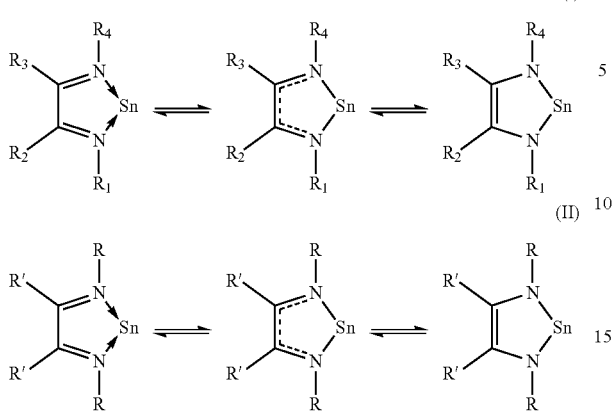

(I)

(II)

Each of these resonance forms imparts a different electronic charge on the tin metal center when bonded together in a metal complex. The form on the left containing two double bonds (the diene) is a neutral, nonionic ligand (DAD0). The resonance form in the center of scheme (I) contains a radical resonance structure and is a monoanionic ligand (DAD1). The resonance form on the right of scheme (I) containing a single double bond is a dianionic ligand (DAD2). The skilled artisan will recognize that the difference between scheme (I) and scheme (II) is the manner of designating the individual R groups. In scheme (I), the R groups on the DAD ligand are numbered R1-R4 indicating that each R group is independently selected. In scheme (II) the R groups are designated as R and R' groups. However, the skilled artisan will recognize that each of the R and/or R' groups of scheme (II) can be independently selected so that the compounds illustrated in scheme (I) are equivalent to the compounds illustrated in scheme (II). For example R1 and R4 in scheme (I) are equivalent to R in scheme (II) and may also be referred to as the nitrogen-R group. Groups R2 and R3 in scheme (I) are equivalent to R' groups in scheme (II) and may also be referred to as the carbon-R groups or carbon-backbone R groups.

For each of the resonance forms, the R groups $R_1$-$R_4$ (of scheme (I)) or R and R' (of scheme (II)) are independently selected from H, C1-6 alkyl, aryl, acyl, alkylamido, hydrazido, silyl, aldehyde, keto, C2-4 alkenyl and/or alkynyl groups and one nitrogen is covalently bound to the tin atom. As used in this manner, the letter "C" followed by a numeral (e.g., "C4") means that the substituent comprises the specified number of carbon atoms (e.g., C4 comprises four carbon atoms). In some embodiments, at least one of the nitrogen-R groups and/or carbon-R groups is not H. In some embodiments, at least one of the nitrogen-R groups and/or carbon-R groups comprises one or more of a C2-C6 alkyl, a C3-C6 alkyl, a C4-C6 alkyl or a C5-C6 alkyl group.

In some embodiments, at least one of the DAD0, DAD1 and/or DAD2 ligands is symmetrical. As used in this manner, the ligand is symmetrical when the nitrogen-R groups are the same and the carbon backbone-R groups are the same. The nitrogen-R groups can be different than the carbon backbone-R groups. In some embodiments, at least one of the DAD0, DAD1 and/or DAD2 ligands are asymmetrical. An asymmetrical ligand may impart rotational entropy on the tin complex which may change the vapor pressure and/or reactivity of the species.

Suitable homoleptic tin-diazadiene complexes includes compounds with the general formula $Sn(DAD)_2$, where DAD is one or more of DAD0, DAD1 or DAD2. A homoleptic species can have a mixture of DAD resonance forms. For example,

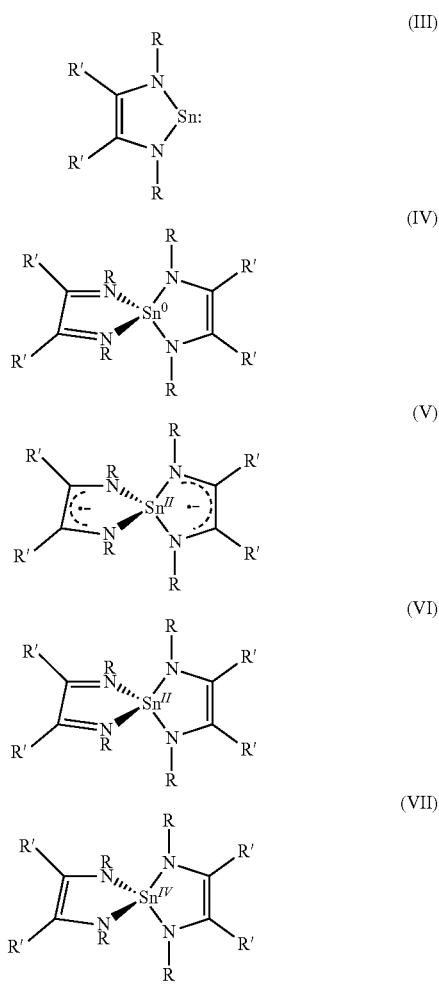

In some embodiments, the Sn-diazadiene complex is heteroleptic. Suitable heteroleptic tin precursors include, but are not limited to,

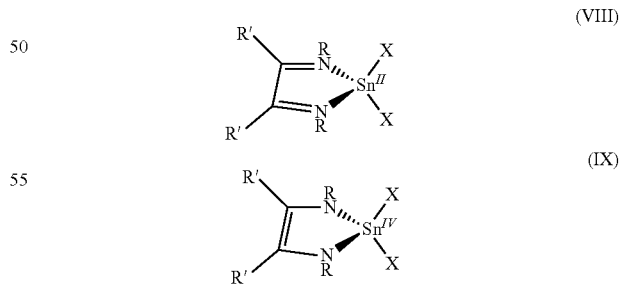

where each X is independently an anionic ligand. Suitable anionic ligands include, but are not limited to, I, Cl, Br, F, $NR_2$ (where R is a C1-C6 alkyl or alkenyl group), cyclopentadiene (Cp), substituted cyclopentadiene, substituted amidinate and allyl. Substituted cyclopentadiene ligands may be substituted by any suitable number of alkyl substituents and/or amino substituents. Alkyl substituents for the cyclopentadiene ligand may include C1-C4 alkyl groups. Amino substituents for the cyclopentadiene ligand may include groups with the general formula —$NR_2$ where each R is independently H or a C1-C4 alkyl group. The alkyl groups can be straight chain groups (e.g. n-butyl) or branched groups (e.g. t-butyl). In some embodiments, the cyclopentadiene ligand is unsubstituted (i.e., $C_5H_5$).

In some embodiments, a metallic tin ($Sn^0$) film is formed. In some embodiments, the film formed consists essentially of tin metal. As used in this manner, the term "consists essentially of tin" means that the film is greater than or equal to about 95%, 98%, 99% or 99.5%. When measuring the composition of the film, the bulk film properties are measured, excluding the interface regions where atoms from adjacent lays may diffuse into the film. To form a metallic tin film, the reactant can be any suitable reducing agent, for example, alcohols, ammonia, molecular hydrogen, hydrazine, substituted hydrazines, substituted cyclohexadienes, substituted dihydropyrazines, aluminum-containing molecules, and plasma versions, thereof.

In some embodiments, the film formed comprises tin oxide (SnO). In some embodiments, the film consists essentially of tin oxide. As used in this manner, the term "consists essentially of" means that the composition of the film is greater than or equal to about 95%, 98%, 99% or 99.5% of the stated elements (in this case tin and oxygen) in sum on an atomic basis. To form an oxide film, the reactant can be any suitable reactant including, but not limited to, water ($H_2O$), molecular oxygen ($O_2$), peroxides, organic alcohols, ozone ($O_3$), nitrous oxide, combinations thereof and plasmas thereof.

In some embodiments, the film comprises tin nitride (SnN). In some embodiments, the film consists essentially of tin nitride. To form a nitride film, the reactant can be any suitable reactant including, but not limited to, ammonia ($NH_3$), hydrazine ($N_2H_4$) substituted hydrazines, combinations thereof and plasmas thereof.

In some embodiments, the film comprises tin carbide (SnC). In some embodiments, the film consists essentially of tin carbide. To form a carbide film, suitable reactants include, but are not limited to, alkanes, alkenes, alkynes, substituted versions thereof, combinations thereof and plasmas thereof.

In some embodiments, the film comprises tin silicide (SnSi). In some embodiments, the film consists essentially of tin silicide. To form a silicide film, suitable reactants include, but are not limited to, silanes, substituted silanes, siloxanes, silyl halide, silyl amide, combinations thereof and plasmas thereof. Examples of silyl halides include, but are not limited to, dichlorosilane (DCS), hexachloridisilane (HCDS), trichlorosilane (TCS) and $SiCl_4$. Examples of silyl amides include, but are not limited to, bis(diethylamino) silane (BDEAS), bis(tert-butylamino)silane (BTBAS), tetrakis(dimethylamino)silane (TDMAS). In some embodiments, the silicon precursor comprises a species with a general formula $Si_nX_aR_{2n+2-a}$, $Si(NR'_2)_aR_{4-a}$, or a siloxane, where n is 1 to 4, a is 0 to 2n+2, each X is an independently selected halide and each R and R' are independently selected from H, C1-4 alkyl or aryl. Suitable siloxanes include, but are not limited to, hexachlorodisiloxane (HCDSO) and octachlorotrisiloxane (OCTSO). In some embodiments, the silicon precursor consists essentially of silane ($SiH_4$).

In some embodiments, the film comprises tin boride (SnB). In some embodiments, the film consists essentially of tin boride. To form a boride film, suitable boron precursors include, but are not limited to, boranes, alkylboranes and haloboranes. In some embodiments, the boron precursor comprises one or more species with a general formula of $B_cH_dX_eR_f$, where each X is a halogen independently selected from F, Cl, Br and I, each R is an independently selected C1-C4 alkyl group, c is any integer greater than or equal to 2, each of d, e and f are less than or equal to c+2 and d+e+f is equal to c+2.

In some embodiments, the film comprises a compound with the general formula $Sn_aB_bC_cN_dO_eSi_f$, where a is in the range of about 1 to about 100 and each of b, c, d, e and f are in the range of about 0 to 100.

In some embodiments, the film comprises an alloy of tin with another metal. Suitable alloy films that can be formed include, but are not limited to, tin titanate, tin tungstate, tin-ruthenium films. In some embodiments, the film comprises tin and one or more of titanium, tungsten or ruthenium. In some embodiments, the alloy film consists essentially of tin and a metal comprising one or more of titanium, tungsten or ruthenium.

Some embodiments of the disclosure are directed to methods of forming ternary materials using tin-diazadiene precursors. In some embodiments, the ternary material comprises tin and two or more of oxygen, nitrogen, carbon, boron, silicon, titanium, ruthenium and/or tungsten. In some embodiments, the film formed comprises or consists essentially of ruthenium tin boride. In some embodiments, the ternary material comprises or consists essentially of tin silicon oxide. In some embodiments, the ternary material layer acts as a catalyst for further surface reactions.

Formation of the ternary material can be accomplished using one or more processes. For example, tin can be deposited by ALD and another metal (or element) can be deposited by CVD or PVD. The third component, oxygen, nitrogen, carbon, boron, silicon, titanium, ruthenium and/or tungsten can be included with deposition of the tin or other metal or in a separate process. In some embodiments, the ternary material is formed by forming a laminate of tin-containing layers and other material layers. For example, a ruthenium tin boride film may be formed as a laminate of tin metal layers interspersed with ruthenium boride layers. The titanium precursor, tungsten precursor and/or ruthenium precursor can be any suitable precursors known to the skilled artisan or, for PVD, a suitable target material comprising the selected components.

The period of time that the substrate is exposed to a process gas may be any suitable amount of time to allow formation of the film or a partial film. As used in this manner, "process gases" are any gases or gaseous species that react with the substrate surface or with a chemisorbed molecule on the substrate surface. For example, a process gas may be flowed into the process chamber for a period of about 0.1 seconds to about 90 seconds. In some time-domain ALD processes, a process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

The temperature of the substrate during deposition can be controlled, for example, by setting the temperature of a substrate support or susceptor. In some embodiments the substrate is maintained at a temperature in the range of about 25° C. to about 500° C., or in the range of about 50° C. to about 450° C., or in the range of about 100° C. to about 400° C., or in the range of about 150° C. to about 350° C., or in the range of about 300° C. to about 300° C.

The tin precursor can be heated prior to flowing into the processing chamber. For example, the tin precursor can be contained within a precursor ampoule which is held at an ampoule temperature to increase the vapor pressure of the precursor. An inert or carrier gas can be flowed through the ampoule to draw the precursor to the processing chamber. In some embodiments, the tin precursor is maintained at a temperature in the range of about 0° C. to about 250° C., or in the range of about 50° C. to about 200° C.

In addition to the foregoing, additional process parameters may be regulated while exposing the substrate to a process gas. For example, in some embodiments, the process chamber may be maintained at a pressure in the range of about 1 mTorr to about 760 Torr, or in the range of about 1 Torr to about 500 Torr, or in the range of about 10 Torr to about 100 Torr.

After exposing the substrate to one process gas, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of greater than 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess process gases and/or excess reaction byproducts from the process chamber to prevent unwanted gas phase reactions. For example, the flow of inert gas may remove excess process gas from the process chamber, preventing a reaction between the tin precursor and a subsequent process gas.

Then the substrate is exposed to a second process gas for a second period of time. The second process gas may react with the species on the substrate surface. The second process gas may be supplied to the substrate surface at a flow rate greater than the first process gas. In one or more embodiments, the flow rate is greater than about 1 time that of the first process gas, or about 100 times that of the first process gas, or in the range of about 3000 to 5000 times that of the first process gas. The second process gas can be supplied, in time-domain ALD, for a time in the range of about 0.1 sec to about 90 sec, or in the range of about 1 sec to about 60 sec, or in the range of about 10 sec to about 30 sec. The second process gas can be supplied at a pressure in the range of about 1 mTorr to about 760 Torr, or in the range of about 1 Torr to about 500 Torr, or in the range of about 10 Torr to about 250 Torr.

The process chamber may again be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the embodiment of the processing method described above includes only two pulses of reactive gases, it will be understood that this is merely exemplary and that additional pulses of process gases may be used. The pulses can be repeated in their entirety or in part. The cycle can be repeated to form a film of a predetermined thickness.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method comprising exposing a substrate in a processing chamber to a deposition cycle comprising exposure to a tin precursor comprising a compound having a tin-diazadiene bond and a reactant to form a tin-containing film, the tin precursor comprises a compound having the formula

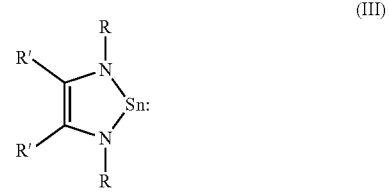

(III)

where each R and R' are independently selected from H, C1-6 alkyl, aryl, acyl, alkylamido, hydrazido, silyl, aldehyde, keto, C2-4 alkenyl and/or alkynyl groups and one nitrogen is covalently bound to the tin atom.

2. The method of claim 1, wherein the tin precursor and the reactant are exposed to the substrate separately.

3. The method of claim 2, wherein the tin precursor and the reactant are separated temporally.

4. The method of claim 2, wherein the tin precursor and the reactant are separated spatially.

5. The method of claim 1, wherein the film comprises one or more of tin metal, an oxide, nitride, carbide, boride or silicide.

* * * * *

UNITED STATES PATENT AND TRADEMARK OFFICE
CERTIFICATE OF CORRECTION

PATENT NO. : 11,286,564 B2
APPLICATION NO. : 16/456964
DATED : March 29, 2022
INVENTOR(S) : Thomas Knisley et al.

It is certified that error appears in the above-identified patent and that said Letters Patent is hereby corrected as shown below:

On the Title Page

Item (56), Column 2, under "References Cited – OTHER PUBLICATIONS", Line 4, replace "Germylenesto" with "Germylenes to".

Item (56), Column 2, under "References Cited – OTHER PUBLICATIONS", Line 14, replace "Sn(1I)" with "Sn(II)".

Signed and Sealed this
Thirty-first Day of May, 2022

Katherine Kelly Vidal
*Director of the United States Patent and Trademark Office*